United States Patent [19]
Tan et al.

[11] Patent Number: 6,007,951
[45] Date of Patent: Dec. 28, 1999

[54] METHOD FOR PRECISE CRYSTALLOGRAPHIC SEMICONDUCTOR WAFER ALIGNMENT ORIENTATION

[75] Inventors: Songshen Tan, Middletown; Jeff Schramm, Hershey, both of Pa.

[73] Assignee: The Whitaker Corporation, Wilmington, Del.

[21] Appl. No.: 08/995,087

[22] Filed: Dec. 19, 1997

[51] Int. Cl.[6] .................................... G03F 9/00
[52] U.S. Cl. ................... 430/22; 430/30; 216/2; 216/12
[58] Field of Search ............... 430/22, 30; 216/2, 216/12

[56] References Cited

U.S. PATENT DOCUMENTS

| | | | |
|---|---|---|---|
| 4,343,877 | 8/1982 | Chiang | 430/5 |
| 4,343,878 | 8/1982 | Chiang | 430/5 |
| 4,397,711 | 8/1983 | Donnelly et al. | 156/643 |
| 4,595,454 | 6/1986 | Dautremont-Smith et al. | 156/647 |
| 5,484,507 | 1/1996 | Ames | 156/644.1 |

OTHER PUBLICATIONS

VLSI Fabrication Principles, Silicon and Gallium Arsenide, Sorab K. Ghandhi, pp. 487 through 490.
Micromachining and Micropackaging of Transducers, 1985, "Submicron Accuracies in Anistropic Etched Silicon Piece Parts—A Case Study", T. L. Poteat, pp. 151 through 158.

Primary Examiner—Christopher G. Young

[57] ABSTRACT

The present invention provides a method for precise alignment of a photomask with the crystalline lattice structure of a semiconductor wafer. An etchmask including a predetermined window configuration is used to etch an alignment guide into the semiconductor substrate. The window configuration includes a plurality of pattern units and a straight, elongated alignment window, each of which has an angular offset with respect to the alignment window. The pattern units are analyzed after etching to determine the pattern unit having the most uniform undercutting. All subsequent photomasks include an alignment array having a plurality of alignment vernier. The vernier corresponding to the pattern unit having the most uniform undercutting is selected for aligning with the long alignment V-groove.

1 Claim, 8 Drawing Sheets

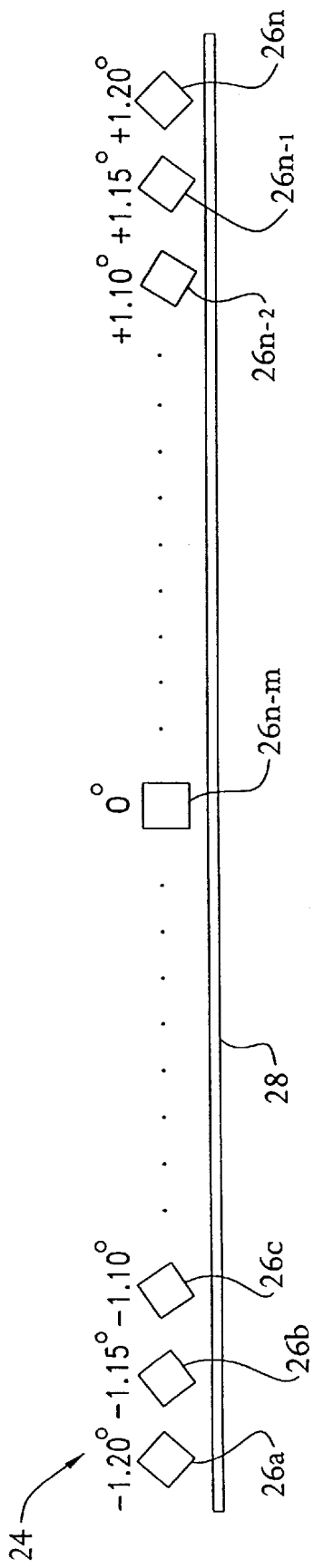
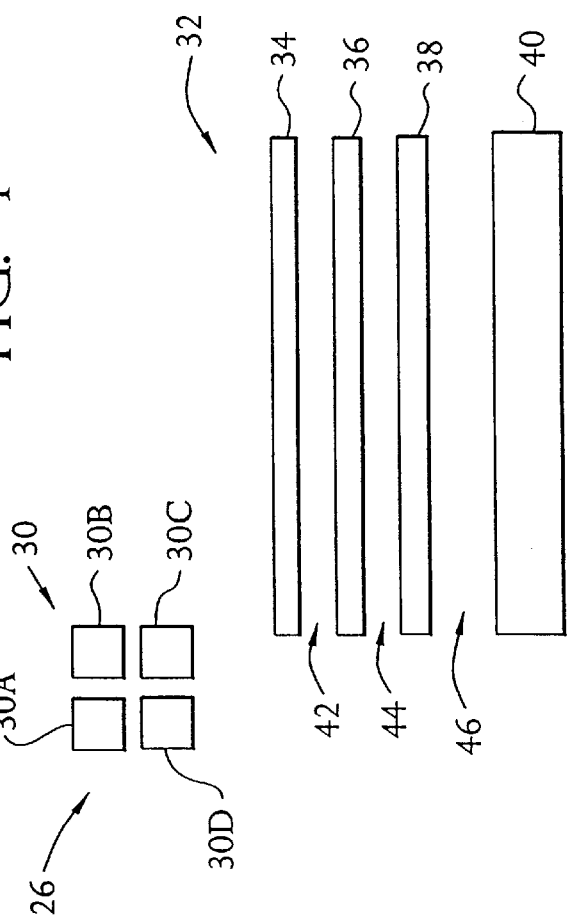
FIG. 4
FIG. 5

METHOD FOR PRECISE CRYSTALLOGRAPHIC SEMICONDUCTOR WAFER ALIGNMENT ORIENTATION

BACKGROUND OF THE INVENTION

1. Field of the Invention

This invention generally relates to semiconductor optoelectronic circuit design and manufacturing. More particularly, it relates to an apparatus and method for precisely aligning a photolithography mask with the orientation of the crystal lattice of a semiconductor wafer.

2. Description of the Related Art

The semiconductor industry has made great strides toward achieving smaller, more densely packed and faster optoelectronic circuits with each successive generation. As a result, it has been increasingly important to refine the tolerances of each step of making an optoelectronic circuit in order to achieve the highest precision circuit possible.

Semiconductor substrates are often used for precisely aligning optical fibers. V-grooves etched into the substrate operate as a guide for the optical fibers that are placed therein. Semiconductor processing technology for transforming a semiconductor substrate into one or more optoelectronic devices involves a complex sequence of processing steps which must be accurately performed to produce properly functioning circuits. One of the most critical steps in the process is generating accurate alignment marks on the semiconductor substrate prior to etching V-grooves into the substrate. When etching a substrate, an etchmask or series of etchmasks, each with a predetermined pattern, is used to permit selective portions of the semiconductor substrate to be etched away while leaving other areas of the substrate intact.

When an etchmask is used to etch a structure such as a V-groove into a semiconductor substrate, a certain amount of undercutting will occur. Using an example of silicon (Si) as the substrate 50 and silicon nitrate (SiNx) as the etchmask 52, it is desired to align the etchmask 52 with the crystal lattice orientation of the silicon substrate 50 as precisely as possible. Referring to FIG. 1, the etchmask 52 has at least one window opening 54 having a certain predetermined width W. This width W is used to achieve a particular desired depth D in the V-groove 56. Precise alignment of the etchmask 52 with the crystal lattice orientation of the substrate 50 results in repeatable and definable etch depth D of the V-groove 56. If the etchmask 52 is properly aligned with the crystal lattice orientation of the substrate 50, symmetrical undercutting 58, (i.e. the same amount of undercutting under all sides of the window opening 54), of the etchmask 52 will occur as shown in FIG. 1. Misalignment of the etchmask 52 and the crystal lattice orientation of the substrate 50 will result in uneven undercutting of the etchmask 52.

The crystal lattice orientation of the substrate has a substantial effect upon the etching process since the etching tends to follow the lattice orientation. As a result, if the etchmask is not properly aligned with the crystal lattice orientation of the substrate, the pattern etched upon the substrate will not be the same as the desired pattern. Accordingly, properly aligning the etchmask with the crystal lattice orientation is critical to achieving more exact tolerances in semiconductor optoelectronic circuit fabrication.

The semiconductor industry has long realized the need for aligning the crystal lattice orientation with the etchmask. Semiconductor substrates, generally shaped as a circle, are provided with a "flat" wherein a portion of the circle is cut as shown in FIG. 2. The flat acts as a guide for aligning the etchmasks thereupon. The equipment used to determine the crystal lattice orientation and mill the flat is accurate to plus or minus 0.5 degrees with respect to the crystal lattice orientation. This 0.5 degree tolerance is unacceptable for certain applications, including the precise alignment of optical fibers in optoelectronics.

Accordingly, there exists a need for a simple procedure for accurately aligning an etchmask with the crystal lattice orientation of the semiconductor substrate.

SUMMARY OF THE INVENTION

The present invention provides a method for precise alignment of etchmasks with the crystal lattice orientation of a semiconductor substrate. A first etchmask includes a predetermined window configuration for etching an alignment guide into the semiconductor substrate. The window configuration includes a straight, elongated alignment window and a plurality of pattern units, each of which has an angular offset with respect to the alignment window. The pattern units are analyzed after etching to determine the pattern unit having the most uniform undercutting. All subsequent photomasks, and their corresponding etchmasks, include an alignment array having a plurality of alignment vernier. The vernier corresponding to the pattern unit having the most uniform undercutting is selected for aligning with the elongated alignment V-groove created by the alignment window.

Accordingly, it is an object of the present invention to provide an improved system and method for aligning photomasks and etchmasks with the crystal lattice orientation of a semiconductor substrate.

Other objects and advantages of the present invention will become apparent after reading the detailed description of presently preferred embodiment.

BRIEF DESCRIPTION OF THE DRAWINGS

FIG. 4 is the window configuration of the photomask shown in FIG. 3;

FIG. 5 is the pattern unit window of the photomask shown in FIG. 3;

DETAILED DESCRIPTION OF THE PREFERRED EMBODIMENT

Figure 1:
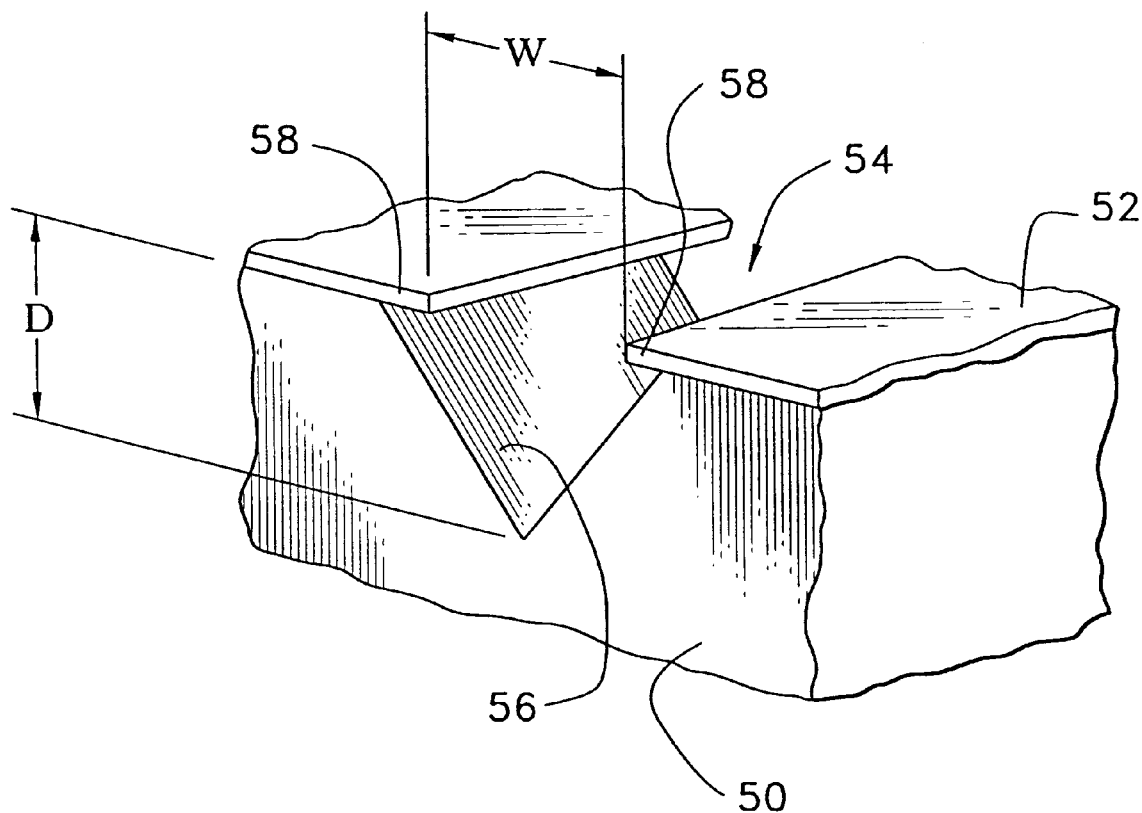
FIG. 1 is a section view of a prior art V-groove etched into a semiconductor wafer.
Figure 2:
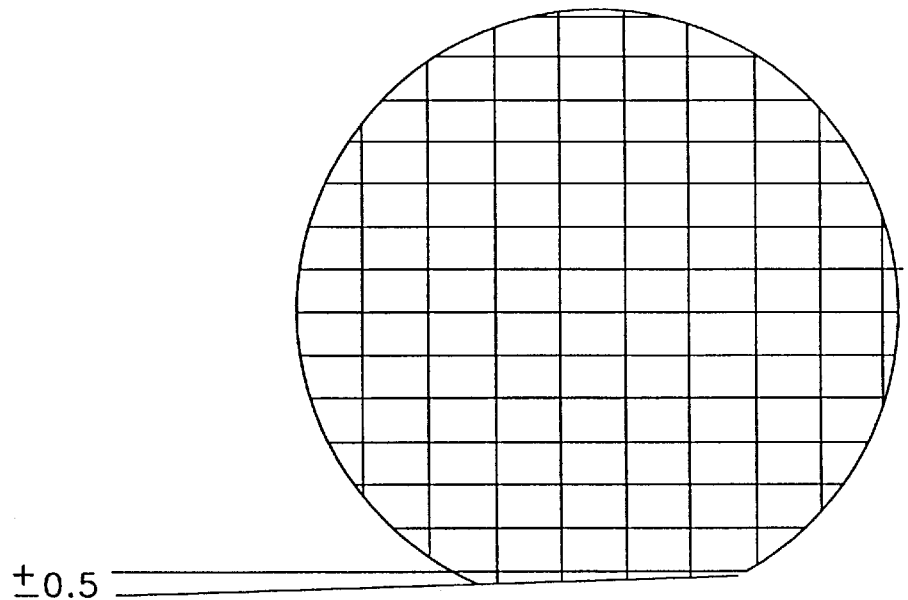
FIG. 2 is a prior art semiconductor wafer having a flat which is misaligned with respect to the crystal lattice orientation.

The preferred embodiment will be described with reference to the drawing figures wherein like numerals represent like elements throughout.

Figure 3:
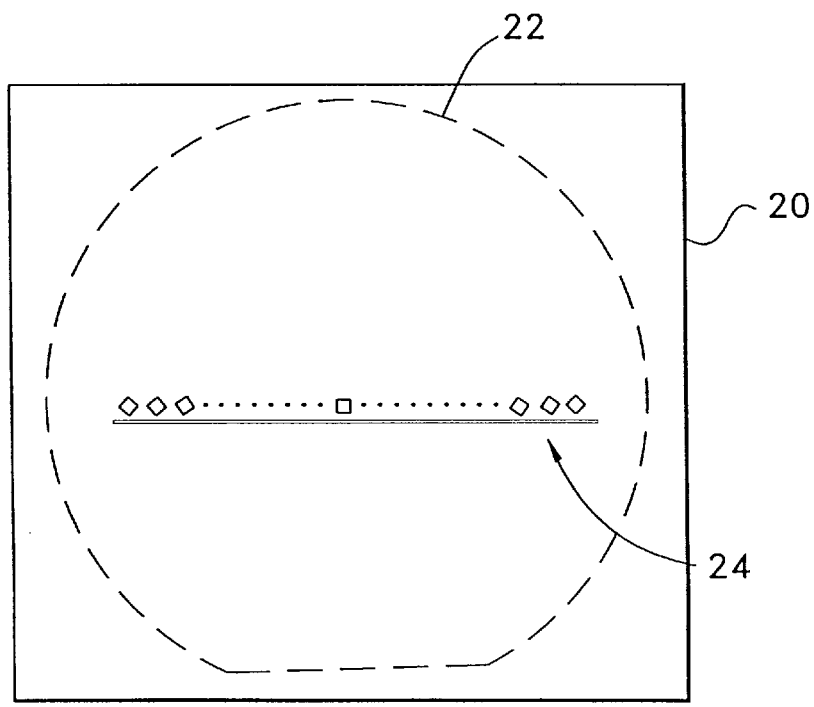
FIG. 3 is a photomask including an alignment guide in accordance with the present invention.

Referring to FIG. 3, a first photomask 20 for precise crystallographic semiconductor wafer orientation is shown superimposed upon a semiconductor wafer 22, such as silicon. The photomask 20 includes a plurality of windows which are arranged in a predetermined configuration 24. In a process that is well known to those of skill in the art, this configuration 24 is ultimately transferred onto an etchmask and etched upon the semiconductor wafer 22 when the etchant is applied. Preferably, a potassium hydrochloride-based etchant is used, which etches silicon crystallographically. The window configuration 24 will be explained in greater detail with reference to FIG. 4.

The window configuration 24 includes a plurality of pattern unit windows 26a–26n and a straight, elongated alignment window 28. The window configuration 24 will etch a pattern into the semiconductor wafer 22 to function as an alignment guide for subsequent photomasks. Although the angular orientation has been greatly exaggerated in FIG. 4 for explanation, the pattern unit windows 26a–26n preferably have an angular offset from normal to the alignment window 28 ranging from minus 1.20 degrees to plus 1.20 degrees in 0.05 degree increments. In the preferred embodiment, the alignment window 28 is approximately 63,500 $\mu$m long and 50 $\mu$m wide. However, those of skill in the art should clearly recognize that the dimensions and angular increments described herein are for illustrative purposes only and these values and ranges of values may vary greatly depending upon the alignment resolution desired and the application. Additionally, the orientation of the window configuration 24 may differ from the orientation shown in FIG. 3, and the orientation of the pattern unit windows 26a–26n with respect to the alignment window 28 may also be modified without departing from the spirit and scope of the present invention.

Referring to FIG. 5, the pattern unit windows 26a–26n are shown in greater detail. Each pattern unit window 26a–26n comprises a matrix portion 30 and a parallel portion 32. The matrix portion 30 comprises four equally sized windows 30A, 30B, 30C, 30D arranged in a symmetrical matrix. Preferably, the windows 30A, 30B, 30C, 30D are 34 $\mu$m square and the entire matrix portion 30 is 80 $\mu$m square.

The parallel portion 32 comprises three small parallel windows 34, 36, 38 and one large parallel window 40. In the example shown and herein described, the small and large parallel windows 34, 36, 38, 40 are all 400 $\mu$m in length. The small parallel windows are 20 $\mu$m wide and the spacing 42, 44 between the small windows 34, 36, 38 is 30 $\mu$m. The large window 40 is 50 $\mu$m wide and the spacing 46 between the large window 40 and the small windows 34, 36, 38 is 50 $\mu$m. It should be noted that there may be more or less square windows or parallel windows as desired.

Figure 6:
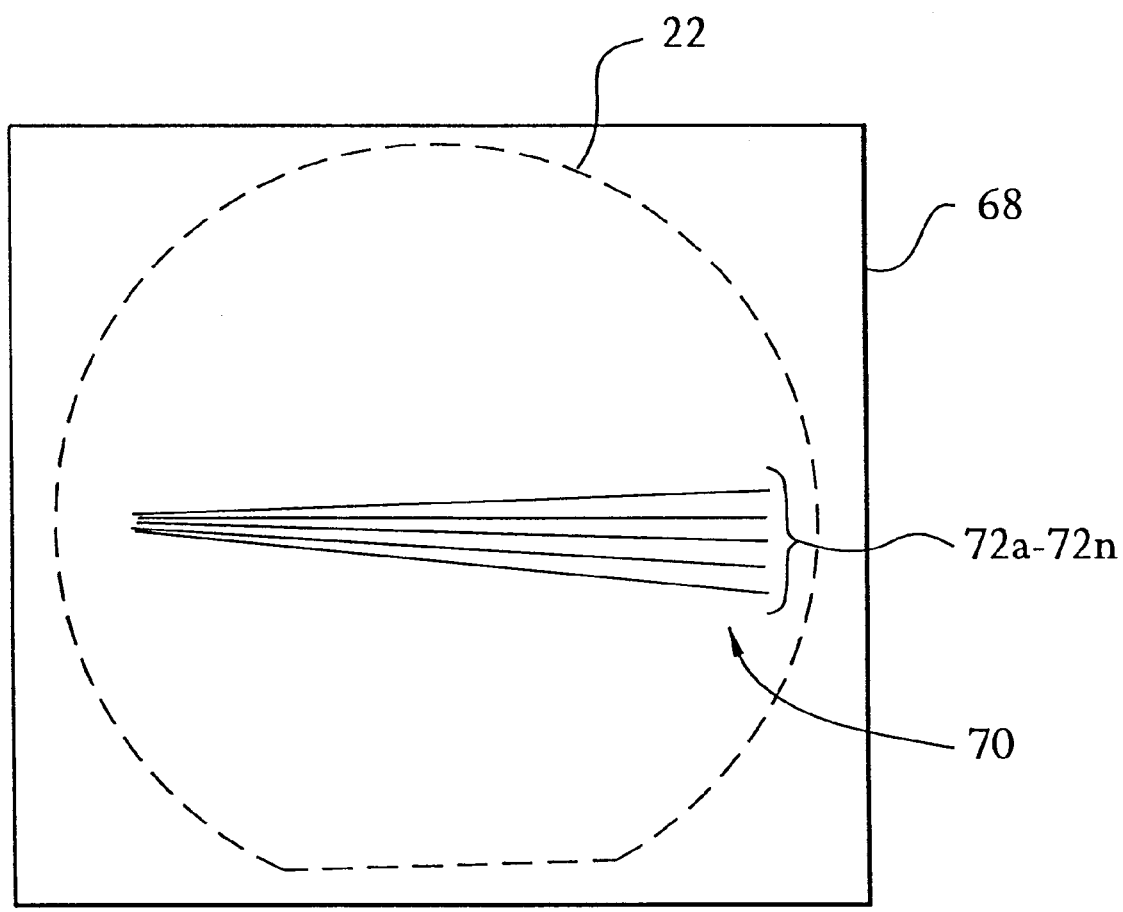
FIG. 6 is a photomask including an alignment array in accordance with the present invention.
Figure 7:
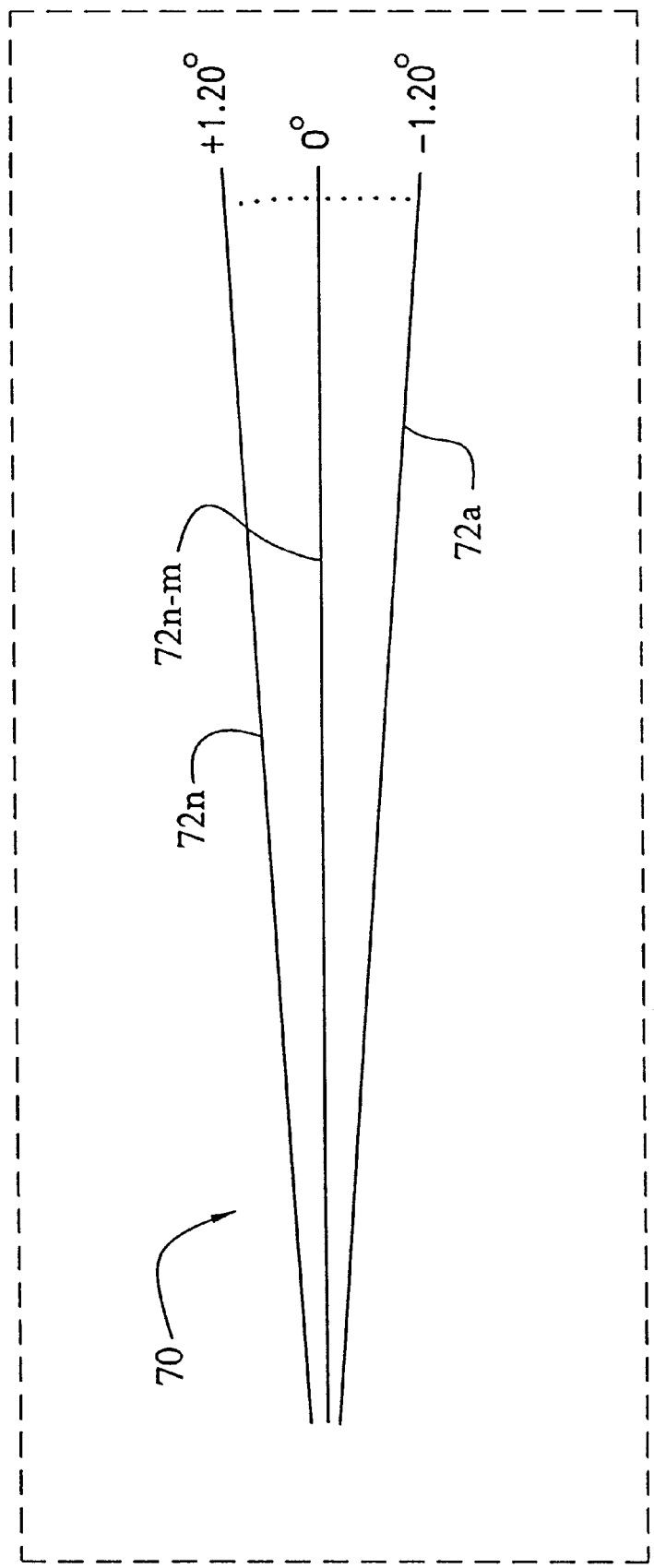
FIG. 7 is the alignment array of FIG. 6 show in greater detail.

Referring to FIG. 6, an alignment array 70 for use on a subsequent photomask 68 is shown. The alignment array 70 comprises a plurality of alignment vernier 72a–72n, each of which has an angular offset relative to the other vernier 72a–72n. The alignment array 70 is shown in greater detail in FIG. 7. The number of alignment vernier 72a–72n is preferably equal to the number of pattern unit windows 26a–26n (shown in FIG. 4), and each alignment vernier 72a–72n has a corresponding pattern unit window 26a–26n. Accordingly, in the example disclosed herein, since there are forty-nine pattern unit windows 26a–26n ranging from minus 1.2 degrees to plus 1.20 degrees in 0.05 degree angular increments, there are also forty-nine corresponding alignment vernier 72a–72n from minus 1.20 degrees to plus 1.20 degrees in 0.05 degree angular increments. For simplicity, only three alignment vernier 72a, 72n–m, 72n are shown. Preferably, the alignment vernier 72a–72n are 63,500 $\mu$m in length, although this exact length is not critical to the present invention. It should be appreciated that the longer the alignment vernier 72a–72n and the alignment window 28 are, the greater the alignment accuracy that will be achieved.

Figure 8A:
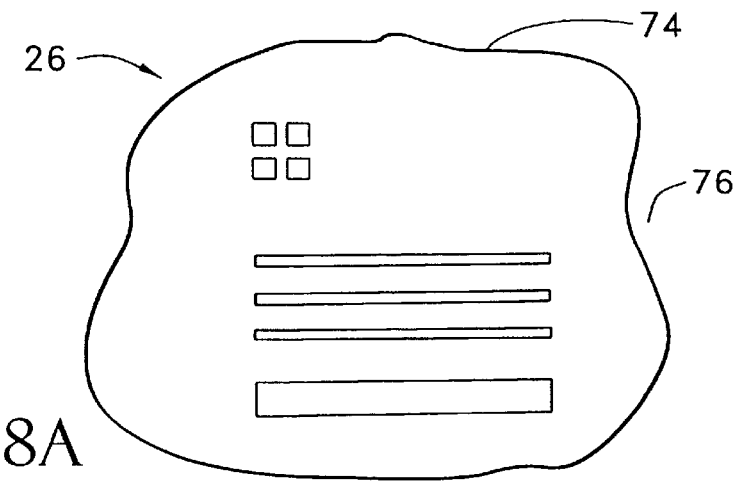
FIG. 8A is an etchmask placed upon a substrate prior to etching.
Figure 8B:
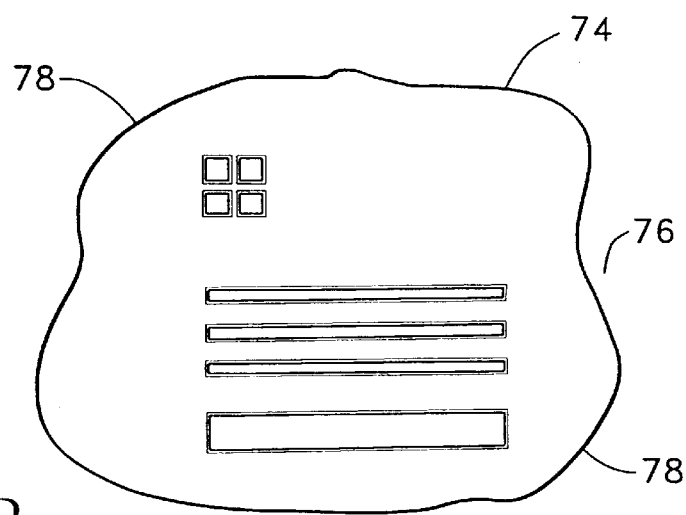
FIG. 8B is an etchmask properly aligned with the crystal lattice orientation of a semiconductor substrate subsequent to etching.
Figure 8C:
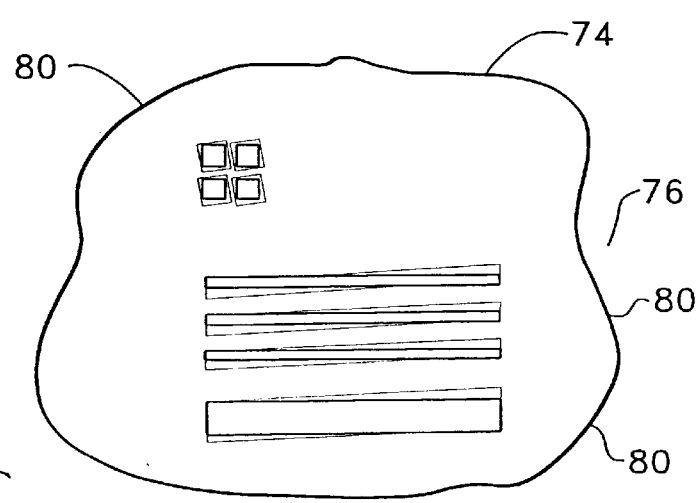
FIG. 8C is an etchmask misaligned with the crystal lattice orientation of a semiconductor substrate subsequent to etching.

One of the alignment vernier 72a–72n will be selected for precisely aligning the subsequent photomask 68 with the crystal lattice orientation of the semiconductor substrate 22 as will be explained in greater detail hereinafter. Referring to FIGS. 8A–8C, a portion of the first etchmask 74 having a pattern unit window 26a–26n is shown. As shown in FIG. 8A, the etchmask 74 prevents the etching solution from etching the semiconductor substrate 76 thereunder. The pattern unit windows 26a–26n will permit the etching solution to etch away those portions of the semiconductor substrate 76 which are not protected by the etchmask 74. As was previously described, etching of the substrate 76 will also result in undercutting. Referring to FIG. 8B, if the etchmask 74 is precisely aligned with the crystal lattice orientation of the substrate 76, uniform undercutting 78 of the etchmask 74 will occur. As shown, this will tend to enlarge the window 26a–26n defined by the etchmask 74 uniformly in all directions. When viewed under a microscope for analysis, the undercutting 78 will appear uniform. Referring to FIG. 8C, misalignment of the etchmask 74 with the crystal lattice orientation of the substrate 76 will result in unsymmetrical undercutting 80. This will result in a structure etched into the substrate 76 which is not desired. If V-grooves with unsymmetrical undercutting 80 are used to align optical fibers, misalignment of the optical fibers will result.

It should be noted that the straight, elongated alignment window 28 may also be misaligned and unsymmetrical undercutting will appear at both ends of the alignment window 28. However, the most central portion of the alignment window 28 will appear to be uniform undercutting and it can be used as a baseline for further alignment.

Figure 9A:
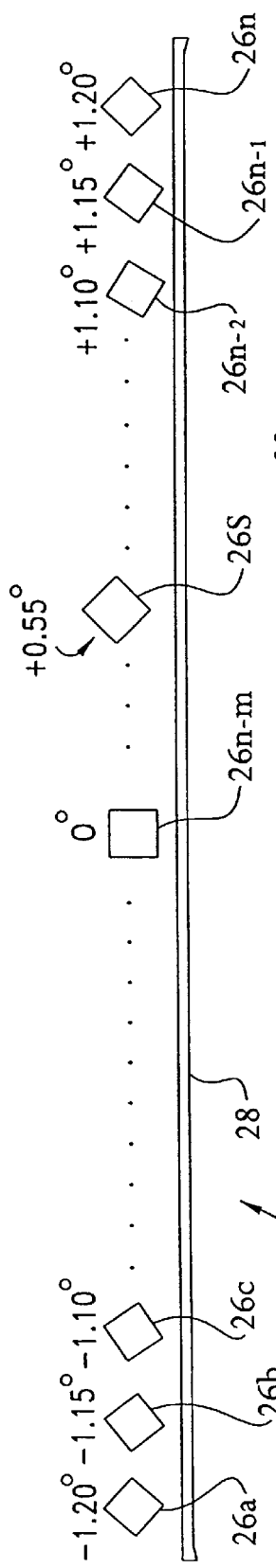
FIGS. 9A–9C are an example of the crystallographic alignment process in accordance with the present invention.
Figure 9B:
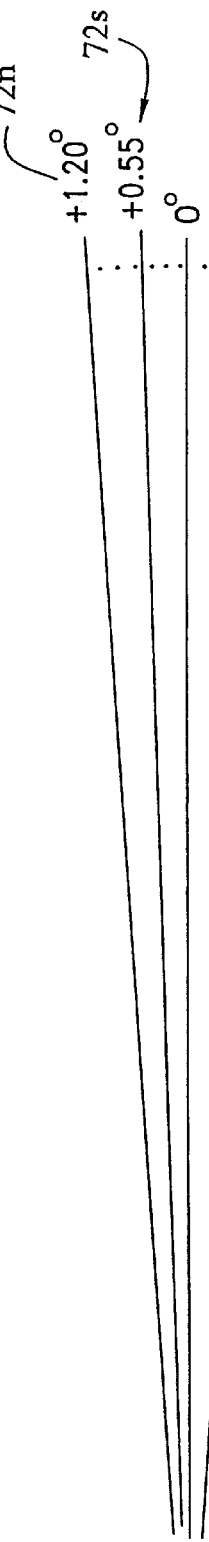
Figure 9C:
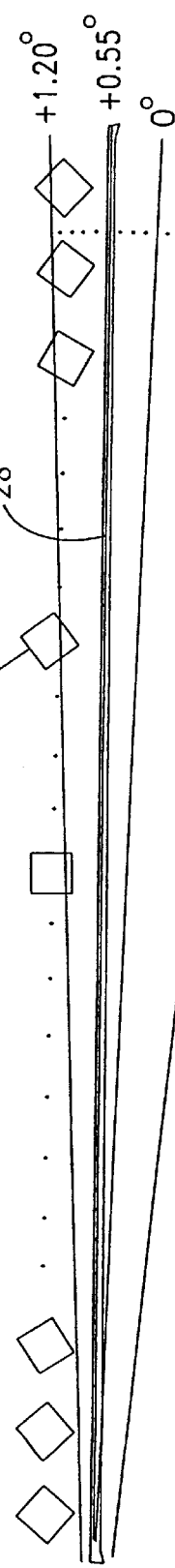

Referring to FIGS. 9A–9C, the crystallographic alignment process in accordance with the present invention will be explained by way of example. As shown in FIG. 9A, the window configuration 24 is etched into the semiconductor substrate 22. After analysis, typically performed with a microscope, if it has been determined that the pattern unit window 26s having the most uniform undercutting is plus 0.55 degrees, this will be the alignment vernier 72s on the subsequent photomask 68 which is selected for alignment as shown in FIG. 9B. Accordingly, referring to FIG. 9C, the alignment vernier 72s having an angular offset of plus 0.55 degrees is aligned with the long alignment V-groove created by the alignment window 28. This will precisely align a subsequent photomask 68 with the crystal lattice orientation of the substrate 22. In essence, the plurality of pattern unit windows 26a–26n are used to distinguish the misalignment angle with respect to the semiconductor substrate 22. The straight, elongated window 28 is used as a baseline for alignment.

Figure 10:
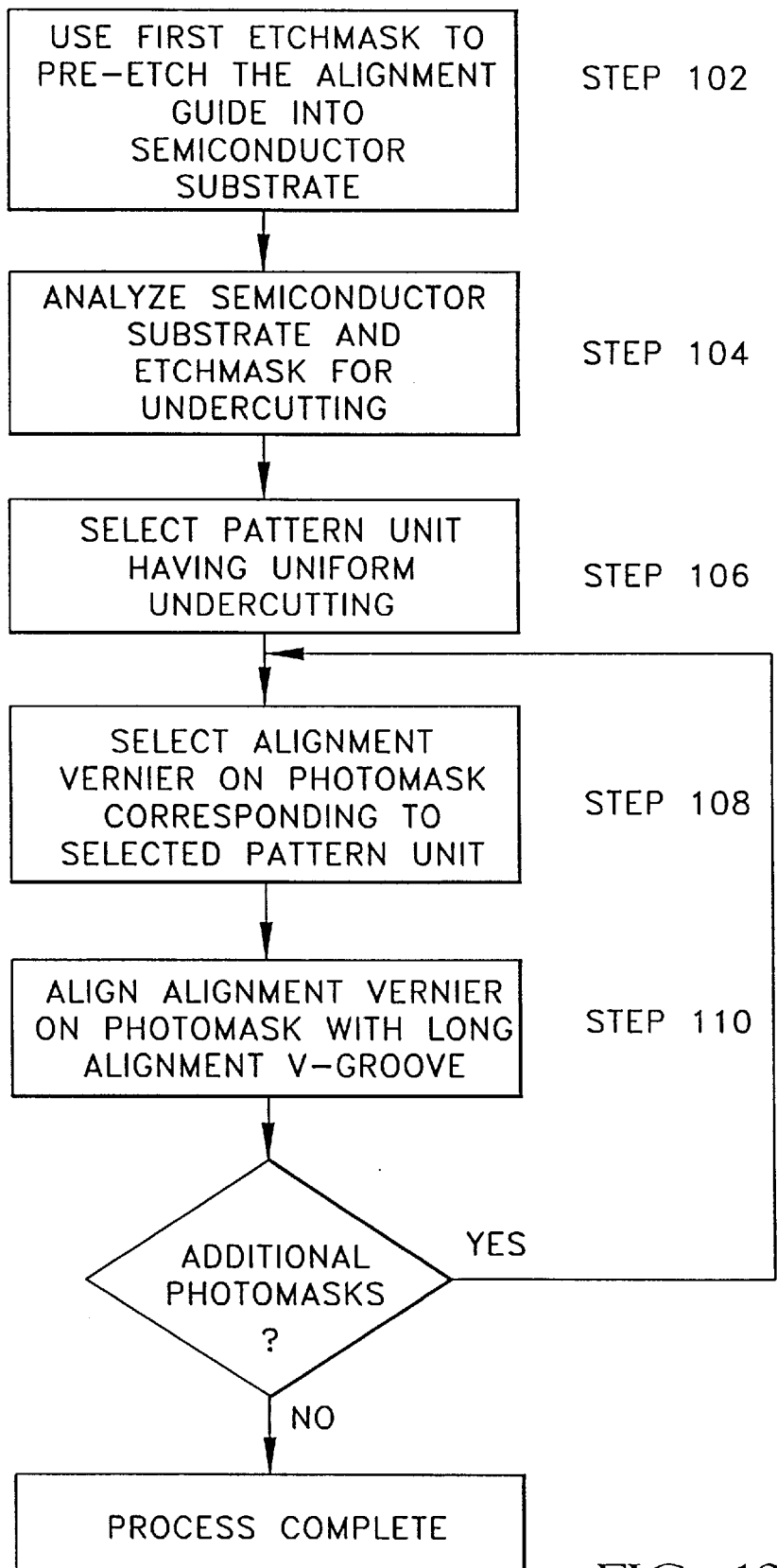
FIG. 10 is a flow diagram of the method for precise crystallographic alignment.

Referring to FIG. 10, the method 100 for precise alignment of a photomask with the crystal lattice orientation of a semiconductor substrate will be summarized. The method 100 is initiated by using an etchmask to pre-etch the alignment guide into the semiconductor substrate (step 102). The substrate is then analyzed to determine the type and amount of undercutting of the etchmask (step 104). The pattern unit having the most uniform undercutting of the etchmask is then selected (step 106). A photomask, having both the alignment vernier and the desired structure is then placed on the semiconductor substrate. The alignment vernier on the photomask corresponding to the pattern unit having the most uniform undercutting is selected (step 108) and aligned with the long alignment V-groove (step 110). Accordingly, the functional pattern defined by the photomask and transferred to the etchmask will be properly aligned with the crystal lattice orientation of the semiconductor substrate. If necessary, each subsequent photomask will also include the alignment array shown in FIG. 7. Accordingly, each subsequent photomask may be precisely aligned with the crystal lattice orientation by repeating steps 108 and 110.

Although the invention has been described in part by making detailed reference to certain specific embodiments, such details is intended to be instructive rather than restrictive. For example, the present invention is not limited to aligning subsequent photomasks with the crystal lattice orientation of the substrate. Any procedure requiring precise alignment may utilize the method disclosed herein to achieve precise alignment. It will be appreciated by those skilled in the art that many variations may be made in the structure and mode of operation without departing from the spirit and scope of the invention as disclosed in the teachings herein.

What is claimed is:

1. A method for aligning a mask with the crystal lattice orientation of a semiconductor substrate including:

using an etchmask to etch an alignment guide into a semiconductor substrate, said alignment guide including an elongated structure and a plurality of pattern structures, each of said pattern structures having a different angular offset with respect to said elongated structure, wherein at least a portion of the etching undercuts said etchmask;

analyzing said undercutting to determine the pattern structure having the most symmetrical undercutting;

providing a second mask having a plurality of alignment apertures, each said alignment aperture corresponding to one of said pattern structures;

selecting the alignment aperture corresponding to said pattern structure having the most symmetrical undercutting; and aligning said selected alignment aperture with said elongated structure such that said second mask is precisely aligned with the crystal lattice orientation of said semiconductor.

\* \* \* \* \*